(12) United States Patent
Hoogendoorn

(10) Patent No.: US 8,816,727 B2
(45) Date of Patent: Aug. 26, 2014

(54) DRIVER CIRCUIT

(71) Applicant: NXP B.V., Eindhoven (NL)

(72) Inventor: Arie Hoogendoorn, Tegelen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/020,301

(22) Filed: Sep. 6, 2013

(65) Prior Publication Data

US 2014/0084986 A1   Mar. 27, 2014

(30) Foreign Application Priority Data

Sep. 26, 2012 (EP) .................................... 12186160

(51) Int. Cl.
*H03K 3/00* (2006.01)
*H03L 5/00* (2006.01)
*G06F 3/14* (2006.01)
*H04L 25/02* (2006.01)
*H03K 19/0175* (2006.01)

(52) U.S. Cl.
CPC .............. *H03L 5/00* (2013.01); *G09G 2370/12* (2013.01); *G06F 3/14* (2013.01); *H04L 25/0264* (2013.01); *G09G 2350/00* (2013.01); *H03K 19/0175* (2013.01)
USPC .......................................... 327/108; 327/333

(58) Field of Classification Search
USPC ....................... 327/108–112, 306, 333; 455/91
See application file for complete search history.

(56) References Cited

U.S. PATENT DOCUMENTS

| 6,859,075 | B1 | 2/2005 | Van der Wagt | |
|---|---|---|---|---|
| 8,378,653 | B2 * | 2/2013 | Mair ............................. | 323/282 |
| 8,384,445 | B2 * | 2/2013 | Wu ................................ | 327/108 |
| 8,542,039 | B2 * | 9/2013 | Li et al. ......................... | 327/109 |
| 2008/0116943 | A1 | 5/2008 | Nair | |
| 2010/0308888 | A1 | 12/2010 | Kubo | |
| 2012/0033747 | A1 | 2/2012 | Chi | |
| 2012/0057262 | A1 * | 3/2012 | Yeh et al. ........................ | 361/58 |
| 2012/0169403 | A1 | 7/2012 | Gupta et al. | |

FOREIGN PATENT DOCUMENTS

JP        2008-219283  A        9/2008

OTHER PUBLICATIONS

"A 66-mW 3.4Gbpa Transmitter PHY for HDMI Applications In 2.5V 40-nm CMOS", retrieved from the Internet at: http://www.design-reuse.com/articles/22347/transmitter-phy-hdmi.html (Dec. 4, 2012).
Extended European Search Report for EP Patent Appln. No. 12186160.3 (Feb. 11, 2013).

* cited by examiner

*Primary Examiner* — Dinh Le

(57) ABSTRACT

A line driver circuit for a High Definition Multimedia Interface (HDMI) transmitter is disclosed. The line driver circuit includes a pre-driver circuit having a pair of pre-driver differential inputs and a pair of pre-driver differential outputs. A driver circuit having a pair of driver differential inputs and a pair of driver differential outputs is also included. Each of the pair of pre-driver differential outputs is coupled to a respective one of the pair of driver differential inputs. Each of the pair of driver differential outputs is coupled to a respective one of a pair of output terminals. The pre-driver further includes a pair of pre-driver cascode transistors. Each of the pre-driver cascode transistors is arranged between one of the pre-driver differential outputs and a respective one of the output terminals and wherein the driver circuit and the pre-driver circuit are operable to receive a current supplied by a HDMI receiver coupled to the pair of output terminals.

14 Claims, 4 Drawing Sheets

DRIVER CIRCUIT

CROSS-REFERENCE TO RELATED APPLICATIONS

This application claims the priority under 35 U.S.C. §119 of European patent application no. 12186160.3, filed on Sep. 26, 2012, the contents of which are incorporated by reference herein.

This invention relates to line driver circuits for High Definition Multimedia Interfaces (HDMI).

The High-Definition Multimedia Interface (HDMI) is an audio/video data interface suitable for transmitting uncompressed digital data and typically connects audio/video devices such as Camcorders, BluRay and DVD players to other devices such as TVs, and PC monitors.

The HDMI interface has several different groups of transmissions lines operating at different frequencies. A first group is the +5V and HPD lines, used for EDID power and feedback to enable RX detection which are continuous voltage lines. DDC lines which support an I2C interface. A CEC line which is a consumer interface ultra low speed line. A HEAC overlayer used to transmit AC signals on the HPD and unused utility lines which can be used for example to provide an Ethernet and SPDIF interface.

A further group of lines are the very high speed serial lines which use a Transition Minimized Differential Signalling (TMDS) technique originally developed for the digital visual interface (DVI) which can be used to transmit signals up to frequencies of several Gigabits per second. TMDS lines are current-driven lines terminated at the HDMI receiver. The HDMI link topology is illustrated in FIG. 1. An HDMI line driver 100 has a differential output driver 10 implemented by transistors T1 and T2. The first terminal of T1 is connected to one of a pair of output terminals 12. The control terminal of T1 is connected to one of a pair of differential inputs 14. The second terminal of T1 is connected to the second terminal of T2. The first terminal of T2 is connected to the second of a pair of output terminals 16. The control terminal of T2 is connected to the second of a pair of differential inputs 18. The arrangement of T1 and T2 is also referred to as a differential pair or long-tailed pair. The transmitter driver is an open-drain for MOSFET technology or open collector for bipolar technology. This means that the output current which may typically be 10 mA is drawn from a connected HDMI receiver 20 which has a pair of resistances arranged between the HDMI receiver inputs and a receiver supply voltage source 22 which is typically 3.3 volts.

The differential output driver or output stage may be driven by a pre-driver. FIG. 2 shows a HDMI line driver 200 including a pre-driver 30 implemented by transistors T3 and T4 arranged as a long tailed pair. First differential output 32 is connected to first differential input 14 of the differential output driver 10. Second differential output 32 is connected to second differential input 18. The first differential output 32 is connected to a power source 39 via pull up resistance R1. The second differential output 34 is connected to a power source 39 via pull up resistance R2. The pre-driver 30 has a first differential input 36 connected to the control terminal of T3 and a second differential input 38 connected to the control terminal of T4.

Deep sub-micron system chips are incompatible with 3.3V required by HDMI as they operate at lower voltages to reduce power. As a result a separate component called an HDMI Level shifter is placed after the system chip output. FIG. 3 illustrates an example implementation. A system chip 40 with an HDMI output is connected to HDMI transmitter level shifter 300 which can have multiple line drivers, each line driver consisting of a pre-driver 30 and an output driver stage 10. The output driver stage 10 can be connected to an HDMI receiver 20. The level shifter is powered from a voltage supply 44. The typical power requirement of each of the pre-drivers can be several milliamperes.

An alternative implementation of a pre-driver and driver is described in an article describing the Synopsys® DesignWare® High Definition Multimedia Interface Transmitter Phy in a 2.5 V 40 nm CMOS process (http://www.design-reuse.com/articles/22347/transmitter-phy-hdmi.html). This circuit relies on using logic as a pre-driver, which can reduce pre-driver power in advanced technology nodes, where logic is low power. The output driver switches output branches of a current mirror, and the switches can be driven by core logic cells. Such an implementation is not very suitable for HDMI level shifters. This is because HDMI level shifters are typically implemented in older technologies, where logic driving rail-to-rail is slow and/or power consuming. Furthermore in a system chip the logic inputs for HDMI are readily available as they are coming from the TMDS encoder, which is an embedded digital block. In a Level-shifter, however, the input signal is an analog differential signal, so using logic as a predriver would require a translation of the differential input to rail-to-rail logic and then translating it back to a differential output again.

Since there is increasing demand for higher bit rates due to the availability of high definition video and due to 3D video, higher pre-driver currents and possibly multiple pre-drivers will be needed in order to drive the output stage.

US2012/0169403 and US2012/0033747 describe a transmitter where the supply voltage for the transmitter circuitry is derived from the receiver supply. However, this requires additional complex biasing, level shifting and voltage regulation circuitry.

There is therefore a need for an improved line driver circuit for HDMI transmitter and HDMI level shifters.

SUMMARY

Various aspects of the invention are defined in the accompanying claims. In a first aspect there is defined a line driver circuit for a High Definition Multimedia Interface (HDMI) transmitter, the line driver circuit comprising a pre-driver circuit having a pair of pre-driver differential inputs and a pair of pre-driver differential outputs, a driver circuit, having a pair of driver differential inputs and a pair of driver differential outputs; wherein each of the pair of pre-driver differential outputs is coupled to a respective one of the pair of driver differential inputs, each of the pair of driver differential outputs is coupled to a respective one of a pair of output terminals, and wherein the pre-driver further comprises a pair of pre-driver cascode transistors, each of the pre-driver cascode transistors being arranged between one of the pre-driver differential outputs and a respective one of the output terminals, and the driver circuit and the pre-driver circuit are operable to receive a current supplied by a HDMI receiver coupled to the pair of output terminals.

In many applications the HDMI transmitter is a portable device such as laptops tablets and cell phones. The receiver, on the contrary, is often a mains-powered device because these are mostly found in televisions, computer monitors and projectors used for presentations. Arranging the pre-driver circuit to receive supply from a connected HDMI receiver reduces the power consumption requirements of the transmitter side. This reduces the power consumption of the portable device and thus extends battery life.

Furthermore, since the currents drawn by the output driver and the pre-driver are summed in-phase and drawn from the receiver, the pre-driver now contributes to the output signal, so the output driver needs to provide less current. This enables the use of smaller devices, which increases bandwidth, which eases the design for higher bitrates without having to draw more current from the local transmitter supply.

Since the pre-driver will have a delay, the pre-driver current will drive the output slightly earlier than the output-driver. This provides inherent slew-rate control of the differential line output since often there is a minimum slew rate requirement to reduce electromagnetic interference, for example the HDMI standard version 1.4 defines a minimum slew rate of 75 ps.

By powering the driver and predriver stages directly from the HDMI receiver, the locally sourced power requirements of the transmitter or level shifter are significantly reduced without the need for complex bias and voltage regulation circuitry.

The pre-driver cascode transistor decouples the driver differential pair inputs connected to the pre-driver differential outputs from the output terminals in a sense that a change on the driver differential input will affect the driver differential output, but a change on the driver differential output will not affect the driver differential inputs. Hence the feedback loop is broken and the structure will not latch-up. This allows the pre-driver to be powered from the receiver without kickback to the gates of the driver if implemented using MOSFETs or bases of the driver transistors if bipolar technology is used.

In embodiments each of the driver differential outputs may be coupled to the output terminals via a transistor operable as a cascode transistor.

In embodiments the driver circuit and pre-driver circuit may comprise a pair of transistors arranged as a long-tailed pair, each long-tailed pair transistor having a first terminal, a second terminal and a control terminal and wherein each first terminal is coupled to a respective differential output, each control terminal is coupled to a respective differential input, the second terminals of each long-tailed pair transistor are coupled together and in operation the value of tail current in the driver circuit is greater than the value of the tail current in the pre-driver circuit.

Embodiments of the line driver circuit may include a series resistance arranged between each of the control terminals of the pre-driver cascode transistors and the bias voltage supply.

Adding a series resistance increases the equivalent inductance of the circuit resulting in increased bandwidth.

Embodiments of the line driver may comprise a further pre-driver circuit having a pair of further pre-driver differential inputs and a pair of further pre-driver differential outputs and wherein each of the pair of further pre-driver differential outputs is coupled to a respective one of the pair of pre-driver differential inputs, each of the pair of further pre-driver differential outputs is coupled to a respective one of the pair of output terminals, and in operation the further pre-driver circuit is arranged to receive a supply current from a HDMI receiver coupled to the pair of output terminals.

Having one or more further pre-driver stages may be useful in optimizing the transistor sizes used, power consumption and slew rate.

In embodiments each of the further pre-driver differential outputs are coupled to the output terminals by a transistor operable as a cascode transistor.

In embodiments the further pre-driver circuit comprises a pair of transistors arranged as a long-tailed pair, each long-tailed pair transistor having a first terminal, a second terminal and a control terminal and wherein each first terminal is coupled to a respective one of the differential outputs, each control terminal is coupled to a respective one of the differential inputs, the second terminals of each long-tailed pair transistor are coupled together and wherein in operation the value of tail current in the pre-driver circuit is greater than the value of the tail current in the further pre-driver circuit.

Embodiments of the line driver circuit may include a series resistance arranged between each of the control terminals of the further pre-driver cascode transistors and the bias voltage supply.

In embodiments the line driver circuit may comprise a first stage pre-driver coupled to a pre-driver, the first stage pre-driver comprising a current mirror having a first current branch and a second current branch programmed by a reference current, a first current switching transistor arranged in series with the first current branch, and a second current switching transistor arranged in series with the second current branch; wherein the first branch is coupled to a respective one of a pair of output terminals, the second branch is coupled to the other of the pair of output terminals, a first of the pair of first stage pre-driver differential inputs is coupled to the control terminal of the first current switching transistor, a second of the pair of further pre-driver differential inputs is coupled to the control terminal of the second current switching transistor and the further predriver is operable to receive a current supplied by a HDMI receiver coupled to the pair of output terminals when either of the first or second current switching transistors are enabled. A first stage pre driver inputs may be driven directly from core logic.

Embodiments of the line driver may draw current from the receiver in the range of 9 to 20 milliamps and in particular 10 milliamps as defined in the HDMI specification.

Embodiments of the line driver may be included in an HDMI transmitter, and HDMI level shifter, and integrated circuit a mobile phone, a tablet computer, a digital camera, a laptop computer.

Embodiments of the invention are now described in detail, by way of example only, illustrated by the accompanying drawings in which.

DESCRIPTION

Figure 1:
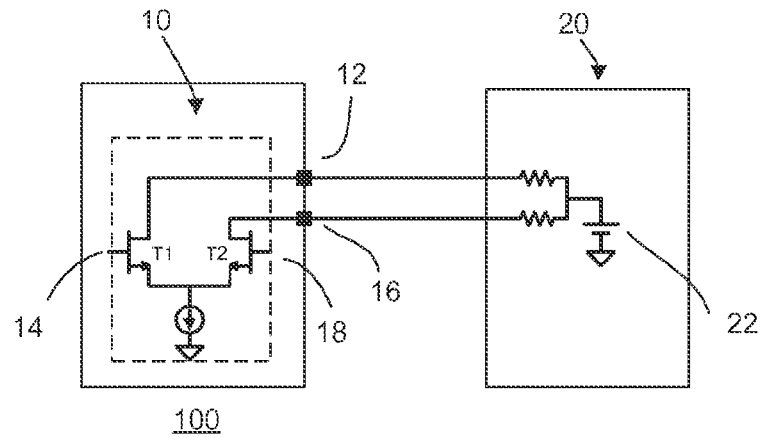
FIG. 1 Shows a HDMI output driver.
Figure 2:
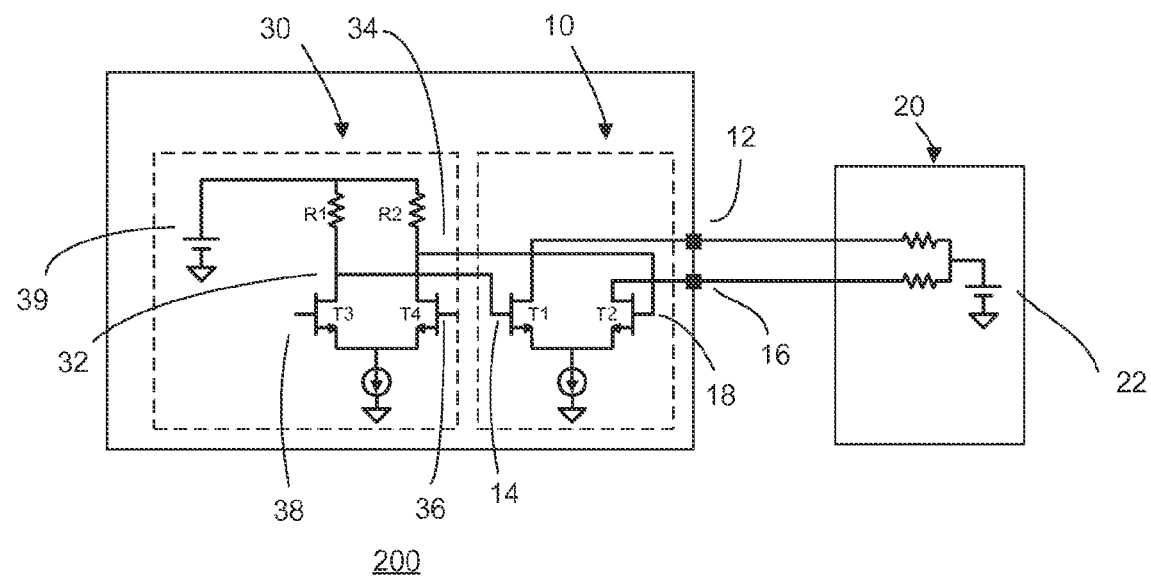
FIG. 2 Illustrates a HDMI output driver and pre-driver.
Figure 3:
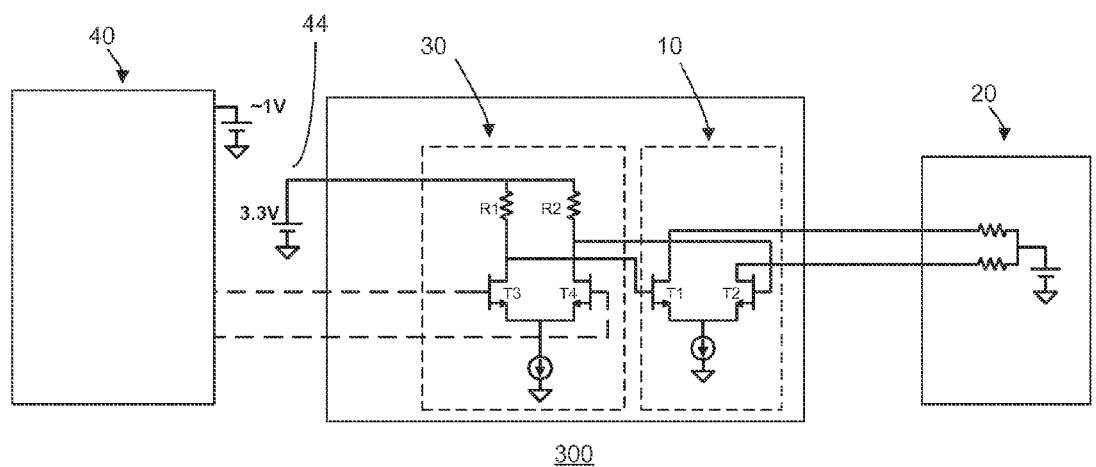
FIG. 3 Shows a HDMI level shifter device.
Figure 4:
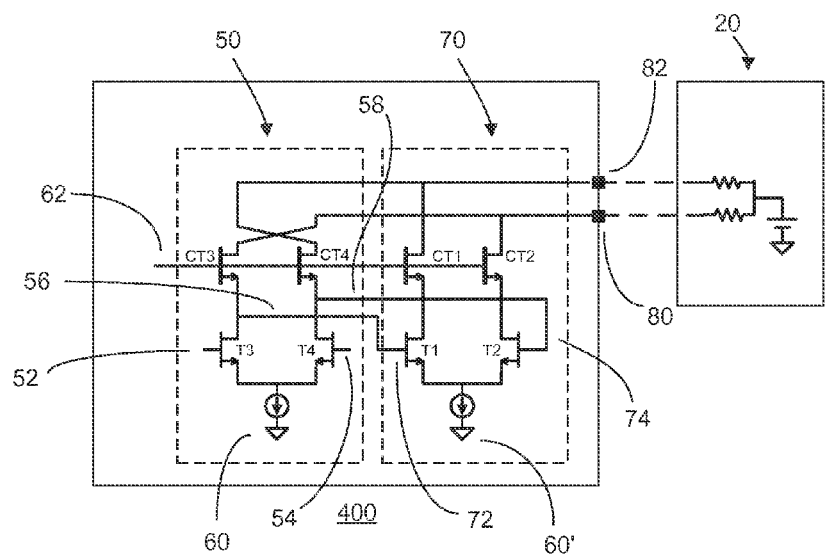
FIG. 4 Illustrates a line driver with an output driver and a pre-driver according to an embodiment.

FIG. 4 shows a line driver 400 including a predriver 50 connected to a driver 70. Predriver circuit 50 may include transistors T3, T4, CT3, and CT4. NMOS transistor T3 has a first terminal which may be a drain coupled to a pre-driver first differential output 56, a second terminal which may be a source coupled to a reference voltage 60 which may be at ground potential, and a gate coupled to a differential input 52. Cascode NMOS transistor CT3 has a first terminal which may be a drain connected to a first output terminal 80 of the line driver 400, a second terminal which may be a source connected to a pre-driver first differential output 56, and a gate connected to a bias voltage 62. The cascode transistor CT3 in combination with transistor T3 may operate as a cascoded amplifier.

NMOS transistor T4 has a first terminal which may be a drain coupled to a second differential output 58, a second terminal which may be a source coupled to a reference voltage 60 which may be a ground, and a gate coupled to a pre-driver second differential input 54. Cascode NMOS transistor CT4 has a first terminal which may be a drain connected to a second output terminal 82 of the line driver 400, a second terminal which may be a source connected to a pre-driver second differential output 58, and a gate connected to the gate of CT3. The cascode transistor CT4 in combination with transistor T4 may operate as a cascoded amplifier.

T3 and T4 operate as a differential pair or long-tailed pair and in operation receive a differential signals on inputs 52 and 54. Cascode transistors CT3 and CT4 may be biased to operate in saturation and so may decouple voltages on pre-driver differential outputs 56 and 58 from the voltage on output terminals 80 and 82.

Driver circuit 70 may include transistors T1, T2, CT1, and CT2. NMOS transistor T1 has a first terminal which may be a drain, a second terminal which may be a source coupled to a reference voltage 60' which may be a ground, and a gate coupled to a driver first differential input 72. The driver first differential input 72 is connected to pre-driver first differential output 56. Cascode NMOS transistor CT1 has a first terminal which may be a drain connected to a second output terminal 82 of the line driver 400, a second terminal which may be a source connected to the first terminal of T1, and a gate connected to a bias voltage 62. The cascode transistor CT1 may operate as a cascoded amplifier together with transistor T1.

NMOS transistor T2 has a first terminal which may be a drain, a second terminal which may be a source coupled to a reference voltage 60' which may be a ground, and a gate coupled to a driver second differential input 74. The driver second differential input 74 is connected to pre-driver second differential output 58. Cascode NMOS transistor CT2 has a first terminal which may be a drain connected to a first output terminal 80 of the line driver 400, a second terminal which may be a source connected to the first terminal of T2, and a gate connected to a bias voltage 62. The transistor CT2 may operate as a cascoded amplifier together with transistor T2.

T1 and T2 operate as a differential pair also known as a long-tailed pair and in operation receive a differential signals on inputs 72 and 74. Cascode transistors CT3 and CT4 may be biased to operate in the saturation region and so decouple voltages on pre-driver differential outputs 56 and 58 from the voltage on output terminals 80 and 82. The gates of cascode transistors CT1, CT2, CT3 and CT4 may be connected together.

In operation the pre-driver 50 receives signals which may be TMDS signals at pre-driver first differential input 52 and pre-driver second differential input 54. The pre-driver outputs 56 and 58 drive the inputs of the final driver stage 72 and 74. The pre-driver 50 is also coupled to the first output terminal 80 and second output terminal 82 and so can receive current from a HDMI receiver when connected to the line driver 400. First output terminal 80 and second output terminal 82 may form part of an HDMI interface. The currents drawn by the output driver and the pre-driver may be summed in-phase when drawn from the receiver. In the TMDS line driver 400 the pre-driver 50 now contributes to the output current and may sink 2 mA. The driver 70 may now sink 8 mA rather than 10 mA for a typical HDMI application which allows an implementation with smaller transistors. Using smaller transistors results in a reduced load to the pre-driver 50. The gates of NMOS cascode transistors CT1, CT2, CT3 and CT4 may be connected together and biased at 1.8 volts+Vt where Vt is the threshold voltage. Gates of NMOS transistors T1, T2, T3 and T4 may be DC biased at 0.4 volts+Vt. The DC biasing circuits connected to the gates of CT1, CT2, CT3 and CT 4 may use circuit techniques known to the skilled person.

In some embodiments, gates of cascode transistors CT1 and CT2 may be connected to a bias voltage which is different to a bias voltage connected to gates of cascode transistors CT3 and CT4. In some embodiments, the line driver drives TMDS signals.

In embodiments the cascode transistors CT1 and CT2 may be omitted from the driver.

Figure 5:
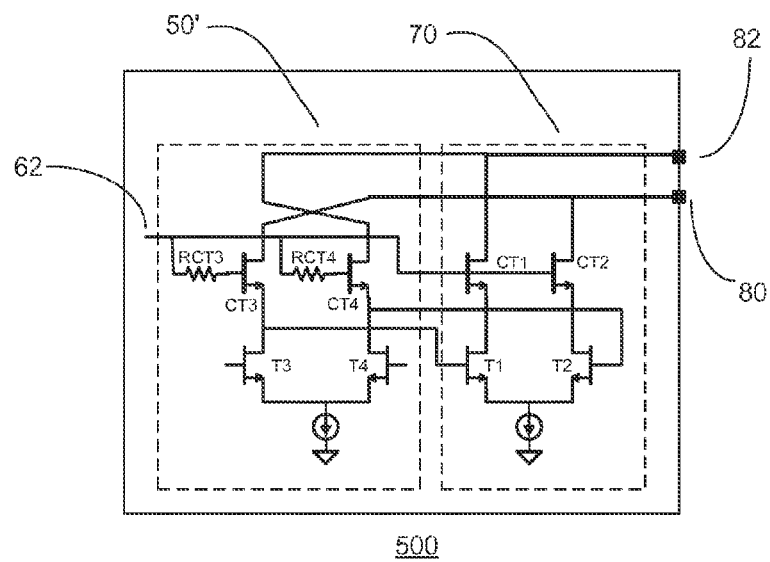
FIG. 5 Shows a line driver with an output driver and a pre-driver according to an embodiment.

FIG. 5 shows a line driver 500. This includes a driver 70 driven by a pre-driver 50'. The pre-driver 50' is the same as pre-driver 50 described in the embodiment of FIG. 4 except for the addition of series resistance Rct3 between bias 62 and the gate of CT3 and series resistance Rct4 between bias 62 and the gate of CT4. When the cascodes CT3 and CT4 are in common gate configuration, placing a resistance in series with the gate is equivalent to a resistance in series with an inductance which results in an increased bandwidth of the pre-driver 50'.

Figure 6:
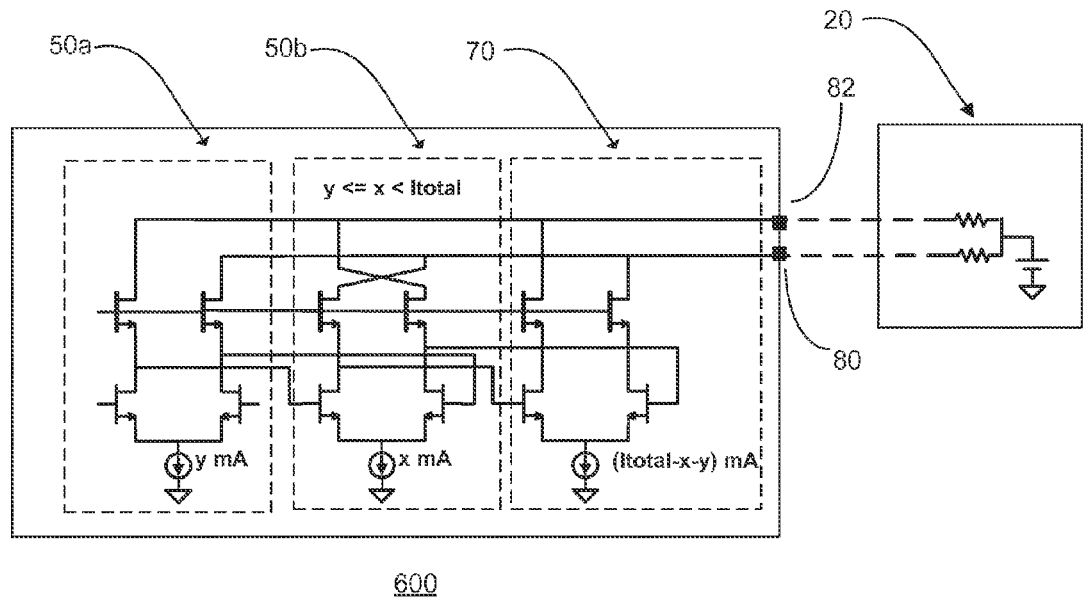
FIG. 6 Illustrates a line driver with an output driver, a pre-driver and a further pre-driver according to an embodiment.

Embodiments may have multiple pre driver stages. An example of this is shown in the line driver 600 of FIG. 6, which has a driver 70, a first predriver 50a and a second predriver 50b. The first predriver 50a drives the second pre-driver 50b and is also coupled to output terminals 80 and 82. In operation of line driver 600, the currents drawn by the output driver 70 and the first pre-driver are summed in-phase and drawn from the receiver. The combined current sink capability of first predriver 50a, second predriver 50b and driver 70 may be 10 mA. The driver 70 may sink more current than the second predriver 50b and the second predriver 50b may sink more current than the first predriver 50a. In general if the total source current is denoted by $I_{total}$, the tail current of the first predriver 50a is y and the tail current of the second predriver 50b is x, then the current drawn from a receiver by the driver will be $I_{total}-x-y$, and the relationship between x, y and $I_{total}$ may be defined as $y<=x \leq I_{total}$. In embodiments the bias voltage of cascode transistors in first predriver 50a may be different to the bias voltage of cascode transistors in the second predriver 50b.

Embodiments of the line driver may draw current $I_{total}$ from the receiver in the range of 9 to 20 milliamps and in particular 10 milliamps as defined in the HDMI specification.

Embodiments may have a resistor between differential output terminals 80 and 82. In this case the line driver has to receive or sink a current considerably greater than 10 mA to provide the same voltage swing.

Other embodiments may have additional pre driver stages. For example if an even rise and fall time of the final TMDS output signals is desired then the total of driver and predriver stages may be an even number.

Figure 7:
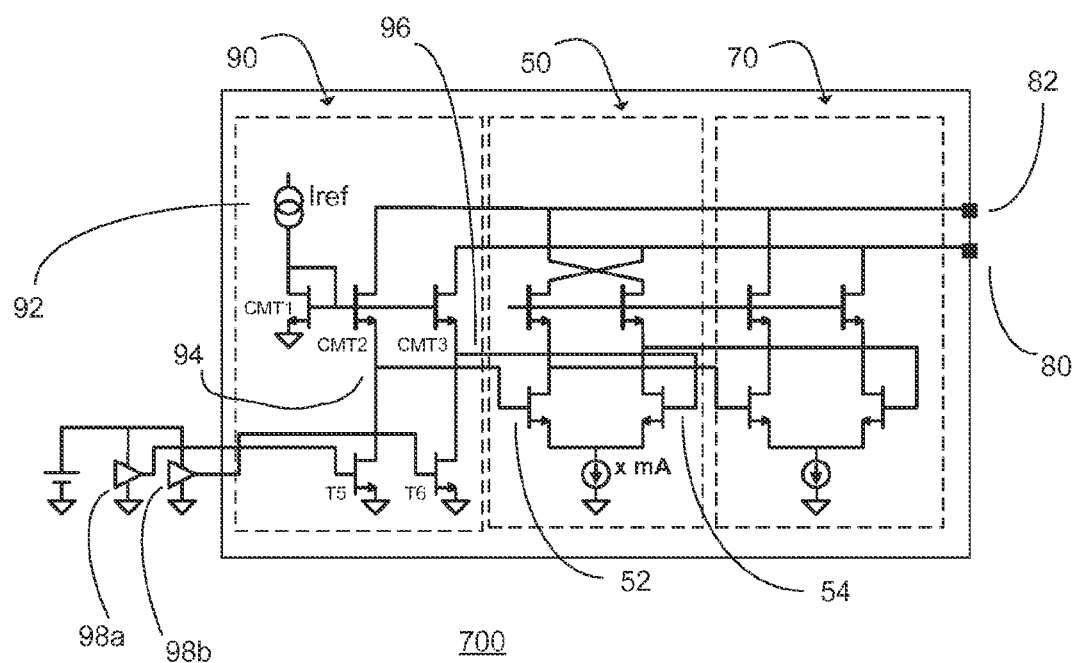
FIG. 7 Shows a line driver with an output driver, a pre-driver and a further pre-driver according to an embodiment.

FIG. 7 illustrates a line driver circuit 700 with first pre-driver stage 90, a pre-driver 50 and driver 70. The first pre-driver stage 90 includes transistors CMT1, CMT2, CMT3, T5 and T6. A current mirror is formed from transistors CMT1, CMT2 and CMT3. NMOS transistor CMT1 has a gate connected to a first terminal which may be the drain and is programmed from a current reference source 92. The second terminal of CMT1 which may be a source is connected to a reference voltage which may be a ground. Transistor CMT2 has a first terminal which may be a drain coupled to a second output terminal 82, a gate which is connected to the gate of CMT1 and a second terminal which may be a drain connected to a first output 94. Transistor CMT3 has a first terminal which may be a drain coupled to a first output terminal 80, a gate which is connected to the gate of CMT1 and a second terminal which may be a drain connected to a second output 96. The first output 94 of a low power pre-driver 90 may be connected to a first input 52 of a pre-driver 50. The second output 96 of a low power pre-driver 90 may be connected to a second input 54 of a pre-driver 50. The current path through CMT2 may be the first branch of the current mirror. The current path through CMT3 may be the second branch of the current mirror.

NMOS transistor T5 has a first terminal which may be a drain connected to first output 94, a gate which can be driven by core logic 98a and a second terminal which may be a source connected to a reference voltage which may be a ground.

NMOS transistor T6 has a first terminal which may be a drain connected to second output 96, a gate which can be driven by core logic 98b and a second terminal which may be a source connected to a reference voltage which may be a ground.

First pre-driver stage 90 operates by transistors T5 and T6 being driven differentially by the core logic and switching the different branches of the current mirror. This may allow the line driver to be driven by low power logic so can be used in advanced technology nodes such as CMOS 40 nanometers and below.

Embodiments of low power pre-driver 90 may have multiple replicas of CMT2 and T5 arranged in parallel. Each replica may source the same programmed value determined by the current source 92. Similarly embodiments of low power pre-driver 90 may have multiple replicas of CMT3 and T6 arranged in parallel. If the reference current value is Iref and there are n replicas then the total current sourcing capability will be n*Iref when the differential inputs are driven and so will have a total current source capability greater than the programmed value determined by the current source. This may allow the locally generated current to be smaller than the current sink capability of the low power pre-driver 90.

Alternative implementations of the line driver may use PMOS MOSFET transistors as well as or instead of NMOS. Embodiments may use transistors implemented using bipolar technology. In MOSFET implementations transistors T1, T2, T3 and T4 may be implemented as thin oxide transistors, whereas cascode transistors CT1, CT2, CT3 and CT4 may be implemented as thick oxide transistors for 3.3 volt operation and 5 volt tolerance Embodiments may have line drivers for each of the pairs of high speed TMDS lines in an HDMI interface. Embodiments of the line driver may be used in systems which drive differential signals other than HDMI link systems, and also in systems which do not use TMDS signalling.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A line driver circuit for a High Definition Multimedia Interface transmitter, the line driver circuit comprising:
   a pre-driver circuit having a pair of pre-driver differential inputs and a pair of pre-driver differential outputs,
   a driver circuit, having a pair of driver differential inputs and a pair of driver differential outputs,
   wherein
   each of the pair of pre-driver differential outputs is coupled to a respective one of the pair of driver differential inputs,
   each of the pair of driver differential outputs is coupled to a respective one of a pair of output terminals, and
   the pre-driver further comprises a pair of pre-driver cascode transistors, each of the pre-driver cascode transistors being arranged between one of the pre-driver differential outputs and a respective one of the output terminals and wherein the driver circuit and the pre-driver circuit are operable to receive a current supplied by a HDMI receiver coupled to the pair of output terminals.

2. The line driver circuit of claim 1 wherein the driver further comprises a pair of driver cascode transistors, and each of the driver cascode transistors is arranged between one of the driver differential outputs and a respective one of the output terminals and wherein the control terminals of the pair of driver cascode transistors are operably biased to a driver cascode bias voltage.

3. The line driver circuit of claim 1 wherein the control terminals of the pair of pre-driver cascode transistors are operably biased to a pre-driver cascode bias voltage.

4. The line driver circuit according to claim 1 wherein the driver circuit and pre-driver circuit each comprise a pair of transistors arranged as a long-tailed pair, each long-tailed pair transistor having a first terminal, a second terminal and a control terminal and wherein
   each first terminal is coupled to a respective differential output,
   each control terminal is coupled to a respective differential input,
   the second terminals of each long-tailed pair transistor are coupled together and in operation the value of tail current in the driver circuit is greater than the value of the tail current in the pre-driver circuit.

5. The line driver circuit according to claim 3 further comprising a series resistance arranged between each of the control terminals of the pre-driver cascode transistors and a bias voltage supply.

6. The line driver circuit of claim 1 further comprising a further pre-driver circuit having a pair of further pre-driver differential inputs and a pair of further pre-driver differential outputs and wherein
   each of the pair of further pre-driver differential outputs is coupled to a respective one of the pair of pre-driver differential inputs,
   the further pre-driver comprises a pair of further pre-driver cascode transistors, each of the further pre-driver cascode transistors being arranged between one of the further pre-driver differential outputs and a respective one of the output terminals, and wherein in operation the further pre-driver circuit is arranged to receive a supply current from a HDMI receiver coupled to the pair of output terminals.

7. The line driver circuit according to claim 6 wherein the further pre-driver circuit comprises a pair of transistors arranged as a long-tailed pair, each long-tailed pair transistor having a first terminal, a second terminal and a control terminal and wherein each first terminal is coupled to a respective one of the differential outputs, each control terminal is coupled to a respective one of the differential inputs, the second terminals of each long-tailed pair transistor are coupled together and wherein in operation the value of tail current in the pre-driver circuit is greater than the value of the tail current in the further pre-driver circuit.

8. The line driver circuit according to claim 6 further comprising a series resistance arranged between each of the control terminals of the further pre-driver cascode transistors and a bias voltage supply.

9. The line driver circuit according to claim 1, further comprising a first stage pre-driver coupled to a pre-driver and wherein the first stage pre-driver comprises:

a current mirror having a first current branch and a second current branch programmed by a reference current, a first current switching transistor arranged in series with the first current branch, and a second current switching transistor arranged in series with the second current branch; wherein the first branch is coupled to a respective one of a pair of output terminals, the second branch is coupled to the other of the pair of output terminals, a first of the pair of further pre-driver differential inputs is coupled to the control terminal of the first current switching transistor, a second of the pair of further pre-driver differential inputs is coupled to the control terminal of the second current switching transistor and the first stage pre-driver is operable to receive a current supplied by a HDMI receiver coupled to the pair of output terminals when either of the first or second current switching transistors is enabled.

10. The line driver circuit according to claim 1 wherein the total value of the current drawn is in the range of 9 mA to 20 mA.

11. An HDMI transmitter comprising the line driver circuit of claim 1.

12. A HDMI level shifter comprising the line driver circuit of claim 1.

13. An integrated circuit comprising the line driver circuit according to claim 1.

14. A mobile hand held device comprising the integrated circuit of claim 13 wherein the mobile hand held device comprises one of a mobile phone, a tablet computer, a digital camera, a laptop computer.

* * * * *